United States Patent
Kuan et al.

(10) Patent No.: US 9,355,992 B2
(45) Date of Patent: *May 31, 2016

(54) LAND GRID ARRAY SEMICONDUCTOR DEVICE PACKAGES

(71) Applicant: Micron Technology, Inc., Boise, ID (US)

(72) Inventors: Lee Choon Kuan, Singapore (SG); David J. Corisis, Nampa, ID (US); Chin Hui Chong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/450,998

(22) Filed: Aug. 4, 2014

(65) Prior Publication Data

US 2014/0342476 A1 Nov. 20, 2014

Related U.S. Application Data

(62) Division of application No. 11/212,215, filed on Aug. 25, 2005, now Pat. No. 8,796,836.

(51) Int. Cl.
*H01L 23/00* (2006.01)
*H01L 23/31* (2006.01)
(Continued)

(52) U.S. Cl.
CPC .............. *H01L 24/92* (2013.01); *H01L 22/14* (2013.01); *H01L 23/3121* (2013.01);
(Continued)

(58) Field of Classification Search
CPC ..... H01L 24/92; H01L 22/14; H01L 23/3121; H01L 23/49531; H01L 23/49861; H01L 24/97; H01L 25/0657; H01L 25/16; H01L 25/50; H01L 24/96
See application file for complete search history.

(56) References Cited

U.S. PATENT DOCUMENTS 5,258,648 A 11/1993 Lin
5,461,255 A 10/1995 Chan et al.
(Continued)

FOREIGN PATENT DOCUMENTS

JP 06077398 A 3/1994
JP 10294335 A 11/1998
(Continued)

OTHER PUBLICATIONS

International Preliminary Report on Patentability for International Application No. PCT/US2006/030669 dated Jul. 22, 2008, 5 pages.
(Continued)

*Primary Examiner* — Laura Menz
*Assistant Examiner* — Candice Y Chan
(74) *Attorney, Agent, or Firm* — TraskBritt

(57) ABSTRACT

A semiconductor device package includes a land grid array package. At least one semiconductor die is mounted to an interposer substrate, with bond pads of the semiconductor die connected to terminal pads on the same side of the interposer substrate as the at least one semiconductor die. Terminal pads of the interposer substrate may be electrically connected to either or both of a peripheral array pattern of lands and to a central, two-dimensional array pattern of pads, both array patterns located on the opposing side of the interposer substrate from the at least one semiconductor die. Additional components, active, passive or both, may be connected to pads of the two-dimensional array to provide a system-in-a-package. Lead fingers of a lead frame may be superimposed on the opposing side of the interposer substrate, bonded directly to the land grid array land and wire bonded to pads as desired for repair or to ease routing problems on the interposer. The land grid array package may be mounted to a carrier substrate, and the lands wire bonded to conductive pads on the carrier substrate. Methods of fabrication are also disclosed.

22 Claims, 5 Drawing Sheets

(51) Int. Cl.
*H01L 23/495* (2006.01)
*H01L 23/498* (2006.01)
*H01L 25/065* (2006.01)
*H01L 25/16* (2006.01)
*H01L 25/00* (2006.01)
*H01L 21/66* (2006.01)

(52) U.S. Cl.
CPC ... *H01L 23/49531* (2013.01); *H01L 23/49861* (2013.01); *H01L 24/96* (2013.01); *H01L 24/97* (2013.01); *H01L 25/0657* (2013.01); *H01L 25/16* (2013.01); *H01L 25/50* (2013.01); *H01L 22/32* (2013.01); *H01L 24/48* (2013.01); *H01L 2224/32225* (2013.01); *H01L 2224/48091* (2013.01); *H01L 2224/48227* (2013.01); *H01L 2224/73265* (2013.01); *H01L 2224/92127* (2013.01); *H01L 2224/97* (2013.01); *H01L 2225/0651* (2013.01); *H01L 2225/06517* (2013.01); *H01L 2225/06527* (2013.01); *H01L 2924/01079* (2013.01); *H01L 2924/01087* (2013.01); *H01L 2924/19041* (2013.01)

(56) References Cited

U.S. PATENT DOCUMENTS

| | | | |
|---|---|---|---|
| 5,681,777 A | 10/1997 | Lynch et al. | |
| 5,751,057 A | 5/1998 | Palagonia | |
| 5,790,384 A | 8/1998 | Ahmad et al. | |
| 5,955,777 A | 9/1999 | Corisis et al. | |
| 5,973,928 A | 10/1999 | Blasi et al. | |
| 6,097,098 A | 8/2000 | Ball | |
| 6,255,729 B1 | 7/2001 | Oikawa | |
| 6,630,372 B2 | 10/2003 | Ball | |
| 6,706,557 B2 | 3/2004 | Koopmans | |
| 6,762,079 B2 | 7/2004 | Vaiyapuri | |
| 7,176,506 B2 * | 2/2007 | Beroz | H01F 17/0033 257/232 |
| 7,291,900 B2 | 11/2007 | Corisis et al. | |
| 7,465,607 B2 * | 12/2008 | Corisis | H01L 23/3121 257/E21.499 |
| 8,021,924 B2 | 9/2011 | Shim et al. | |
| 2003/0234451 A1 | 12/2003 | Razon | |
| 2004/0007782 A1 | 1/2004 | Hedler et al. | |
| 2005/0133916 A1 | 6/2005 | Karnezos | |
| 2005/0139980 A1 | 6/2005 | Burns | |
| 2005/0263873 A1 | 12/2005 | Shoji | |
| 2006/0220210 A1 | 10/2006 | Karnezos et al. | |
| 2007/0045818 A1 | 3/2007 | Kuan et al. | |

FOREIGN PATENT DOCUMENTS

| | | |
|---|---|---|
| JP | 11307688 A | 11/1999 |
| JP | 2001203318 A | 7/2001 |
| JP | 2001319990 A | 11/2001 |
| JP | 2002016182 A | 1/2002 |
| JP | 2002261204 A | 9/2002 |
| JP | 2005072505 A | 3/2005 |
| WO | 2004102653 A1 | 11/2004 |

OTHER PUBLICATIONS

International Search Report for International Application No. PCT/US2006/030669 dated Apr. 25, 2008, 3 pages.
International Written Opinion for International Application No. PCT/US2006/030669 dated Apr. 25, 2008, 4 pages.
Japanese Notice of Rejection for corresponding Japanese Patent Application No. 2008-527946, mailed Jan. 25, 2011, 6 pages.
Taiwanese Search Report for Taiwanese Application No. 095129334 dated Sep. 14, 2008, 2 pages.

* cited by examiner

LAND GRID ARRAY SEMICONDUCTOR DEVICE PACKAGES

CROSS-REFERENCE TO RELATED APPLICATION

This application is a divisional of U.S. patent application Ser. No. 11/212,215, filed Aug. 25, 2005, now U.S. Pat. No. 8,796,836, issued on Aug. 5, 2014, the disclosure of which is hereby incorporated herein in its entirety by this reference.

BACKGROUND

1. Field of the Invention

The present invention relates generally to packaging of semiconductor devices and, more particularly, to semiconductor device packages incorporating a land grid array package therein, wherein the land grid array package may be configured to bear additional components, to enhance repairability, or both, as well as methods of fabricating such packages and related assemblies.

2. Discussion of Related Art

Semiconductor dice are becoming ever-smaller in dimension, both from advances in fabrication technology and as so-called "shrinks" of initial semiconductor die designs are developed to increase the number of dice which may be fabricated on a wafer or other bulk semiconductor substrate. As a consequence, it becomes more difficult to employ lead frame-based packaging techniques using, for example, wire bonds to directly connect bond pads of a die to lead fingers of a lead frame due to diminishing size of bond pads as well as decreasing pitch (spacing) between adjacent bond pads, rendering it difficult, if not impossible in some circumstances, to place inner ends of lead fingers of a lead frame in close proximity to bond pads to which they are to be wire bonded. In addition, below a certain minimum bond pad size and pitch, it becomes impossible to position a wire bonding capillary head accurately enough to avoid contact with, and possible damage to, adjacent bond pads.

Further, when bond pads are arranged along a central axis of a semiconductor die, such as is conventional in so-called "leads over chip," or "LOC" packages, one may be faced with a choice between overcrowding lead fingers to place them in close proximity to the bond pads, or forming overly long wire bonds between the bond pads and remotely placed inner ends of lead fingers and risking potential breakage of the wire bonds or shorting between adjacent wire bonds when the package is being transfer-molded in an encapsulant by so-called "wire bond sweep" initiated by the flow front of the molten encapsulant moving over the active surface of the semiconductor die.

In addition, most conventional packages do not facilitate high device density in conjunction with high multi-die device yields in terms of utilizing available "real estate" on a printed circuit board or other higher-level packaging. Further, most conventional packages do not afford the capability to readily assemble dissimilar components into a single package so as to provide, for example, a so-called "system-in-a-package" or to provide a repair capability to the package either before or after all of the components thereof have been assembled and connected. In addition, such capabilities are not afforded by existing land grid array packages suitable for use on a variety of carriers, for example lead frames as well as printed circuit boards.

Therefore, it would be desirable to provide a semiconductor device assembly packaging configuration which would accommodate ever-smaller semiconductor dice and their smaller, more closely pitched bond pads, and which would also facilitate the fabrication of highly reliable multi-die assemblies offering relatively high device densities and enhanced repairability.

BRIEF SUMMARY

The present invention comprises a semiconductor device package including a land grid array package. The present invention further comprises a semiconductor device package including a land grid array package having an electrical component in the form of at least one active component, at least one passive component, or both, connected thereto.

In one embodiment, the present invention comprises at least one semiconductor die mounted to an interposer substrate, with wire bonds extending from bond pads of the semiconductor die to terminal pads on the side of the interposer substrate to which the at least one semiconductor die is mounted. The terminal pads of the interposer substrate are electrically connected to a land grid array pattern of pads or lands extending along one or more edges of the interposer substrate and to a two-dimensional (in the X and Y directions), more centrally located array pattern of pads, both pad patterns located on the opposing side of the interposer substrate from the at least one semiconductor die. The at least one semiconductor die and wire bonds are overmolded with an encapsulant, leaving the opposing side of the interposer substrate free of encapsulant, to form a land grid array package also providing a two-dimensional pad array suitable for open/short testing and functional testing of the assembly before the land grid array package is incorporated in a higher-level assembly.

The latter, two-dimensional pad array may also be employed in accordance with the present invention, for connection of one or more active components, one or more passive components, or both types of components, to the land grid array package. In addition, pads of the two-dimensional pad array may be employed in a repair function, to connect pads by wire bonding to lead fingers of a lead frame in case there are open, or shorted power, ground, bias or signal paths in the interposer. Further, some or all of the two-dimensional array of pads may be connected to different terminal pads than those to which the lands are connected, to ease routing difficulties and simplify design of the interposer substrate by enabling some terminal pads to be connected to lead fingers of a lead frame through lands as described below, while others may be connected to lead fingers by wire bonds extending from pads of the two-dimensional array.

It is also contemplated that the pads of the two-dimensional array may be bumped with a conductive material to facilitate connection of other components or wire bonds thereto.

In fabrication of a lead frame-based semiconductor device package according to the present invention, lead fingers of a lead frame superimposed on the opposing side of the interposer substrate may be bonded directly to the land grid array lands. Further, as noted above, some of the lead fingers may be connected to pads of the two-dimensional array through wire bonds, either to ease routing difficulties on the interposer substrate or to repair defective power, ground, bias, or signal paths. A conventional trim and form operation may be used to remove the lead frame surrounding the lead fingers as well as tie bars or dam bars extending therebetween, and form the outer ends of the lead fingers to final shape and length.

Before or after connection of the land grid array package to the lead frame, one or more passive components (e.g., resistor, inductor, capacitor), one or more active components (e.g., another semiconductor die) or both, may be mechanically and electrically connected to pads of the two-dimensional array. As noted above, these pads may be conductively bumped with discrete conductive elements to facilitate such connections or, for example, a flip-chip configured die bearing discrete conductive elements thereon may be connected directly to the pads. If a flip-chip configured or other discrete conductive element connector array-type semiconductor die is connected to the land grid array package, a dielectric underfill may also be disposed between the die and the interposer substrate and around the discrete conductive elements.

In fabrication of a carrier substrate-based semiconductor device package according to the present invention, conductive pads of circuitry carried on or within a carrier substrate to which the land grid array package is mounted may be wire bonded directly to the land grid array lands. Further, as noted above, some of the conductive pads may be connected to pads of the two-dimensional array of pads to bypass defective electrical paths or to simplify the structure of the interposer substrate. The wire bonds may be encapsulated with a protective dielectric material.

Before or after connection of the land grid array package to the carrier substrate, one or more passive components (e.g., resistor, inductor, capacitor), one or more active components (e.g., another semiconductor die) or both, may be mechanically and electrically connected to pads of the two-dimensional array. As noted above, these pads may be conductively bumped to facilitate such connections or, for example, a flip-chip configured die bearing discrete conductive elements thereon may be connected directly to the pads. If a flip-chip configured or other discrete conductive element connector array-type semiconductor die is connected to the land grid array package, a dielectric underfill may also be disposed between the die and the interposer substrate and around the discrete conductive elements.

Methods of fabricating lead frame-based semiconductor device packages including a land grid array package are also encompassed by the present invention, as are land grid array packages suitable for use in the semiconductor device assemblies of the present invention.

DETAILED DESCRIPTION OF THE ILLUSTRATED EMBODIMENTS

Figure 1:
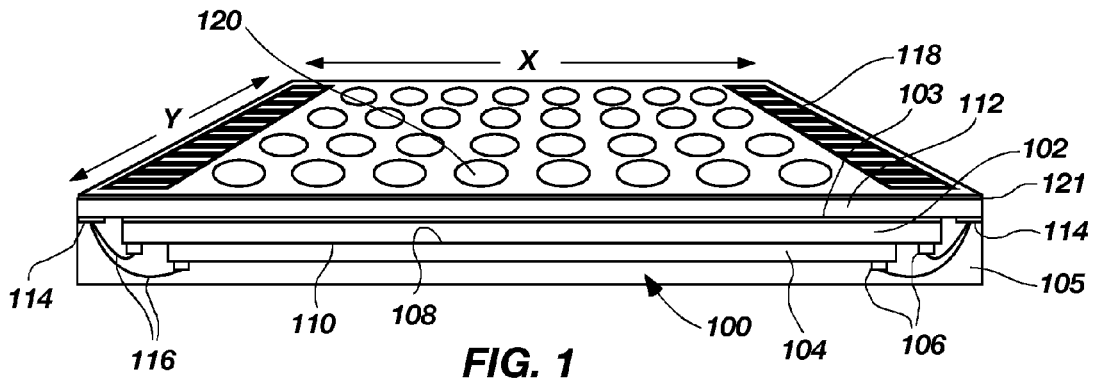
FIG. 1 is a perspective view of one land grid array package configuration according to the present invention with a near side of the package cut away to depict internal components.

In the description which follows, like features and elements have been identified by the same or similar reference numerals for ease of identification and enhanced understanding of the disclosure hereof. Such identification is by way of convenience for the reader only, however, and is not limiting of the present invention or an implication that features and elements of various components and embodiments identified by like reference numerals are identical or constrained to identical functions.

Referring now to FIG. 1 of the invention, land grid array package 100 comprises first and second semiconductor dice 102 and 104, each of which bears bond pads 106 adjacent opposing peripheral edges thereof, according to a selected pinout design, which may be customized using a redistribution layer to relocated inner lead bond locations to more peripheral, outer lead bond locations of bond pads 106. As can be seen in FIG. 1, semiconductor die 104 is slightly shorter in length than semiconductor die 102, so that as semiconductor die 104 is mounted by its back side 108 to the active surface 110 of semiconductor die 102, bond pads 106 of semiconductor die 102 remain exposed. Semiconductor die 102 is mounted by its back side 108 to interposer substrate 112, the bond pads of each semiconductor die 102 and 104 being electrically connected to terminal pads 114 disposed in rows along opposing edges of interposer substrate 112 by wire bonds 116 extending therebetween. The side of interposer substrate 112 bearing semiconductor dice 102 and 104 is encapsulated in an encapsulant structure of dielectric material 105 covering the semiconductor dice 102 and 104, wire bonds 116 and terminal pads 114. Desirably, the encapsulant structure extends to the lateral periphery of interposer substrate 112. Encapsulation may be effected by conventional techniques such as, by way of example only, transfer molding, injection molding and pot molding.

Some or all of terminal pads 114 may be electrically connected through a conductive via to an associated conductive land 118 in a row of lands 118 extending along the same edge, but on an opposing side of, interposer substrate 112. Some or all of terminal pads 114 may also be electrically connected through a via (which may be the same or a different via) and a conductive trace to a conductive pad 120 of an array of pads 120 located in a central region of interposer substrate 112 between the rows of lands 118 and on the same side of interposer substrate 112 thereas. It is, thus, contemplated that a terminal pad 114 may be connected to a land 118 and redundantly connected to a pad 120, only to a land 118 or only to a pad 120. Thus, semiconductor dice 102 and 104 may be electrically accessed through contact with test pads 120 or through lands 118 or both, depending on the selected design for interposer substrate 112. Pads 120 may be used for open/short testing and functional testing of the semiconductor dice 102 and 104 of land grid array package 100 prior to final assembly with other components or for other purposes as described below. The pinouts of the lands 118 as well as the pads 120 may, of course, be customized for, respectively, connection to a lead frame or conductive pads of a carrier substrate such as, for example, a printed circuit board as further described below as well as for testing. The dimensions and pinouts of land grid array package may be selected for compatibility with all Flash and random access (RAM) memory semiconductor devices.

Figure 2:
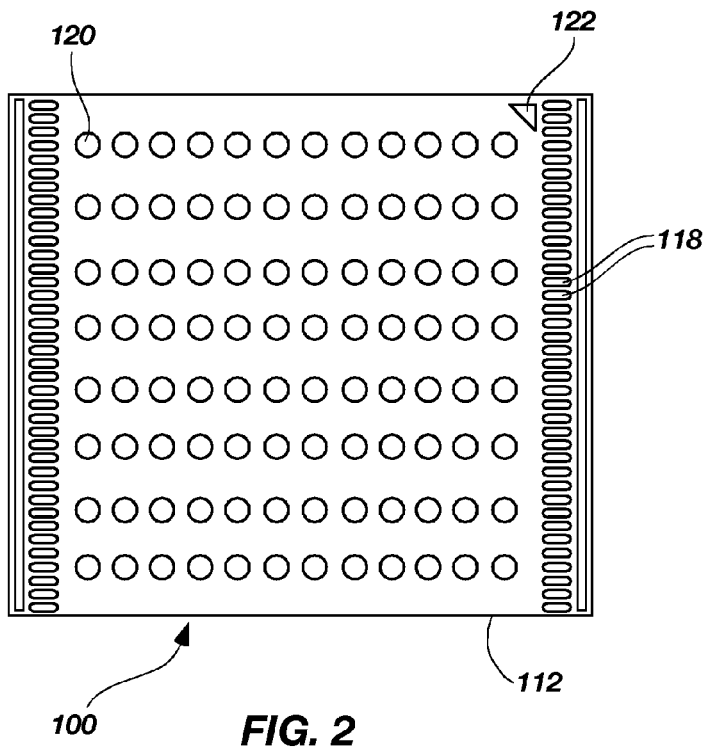
FIG. 2 is a top elevation of the land grid array package of FIG. 1.
Figure 2A:
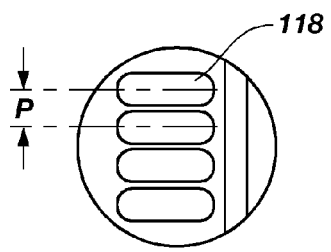
FIG. 2A is an enlarged view of the circled area in FIG. 2.

Referring now to FIG. 2, the configuration of the central, two-dimensional array of pads 120 may be clearly seen, pads 120 being exposed, for example, through 0.300 mm openings in a solder mask on interposer substrate 112. As shown, the location, or identification of Pin A1 of the pinout pattern of lands 118 may be identified by a fiducial mark 122 at a corner of interposer substrate 112 immediately inboard of a row of lands 118. Such a fiducial mark 122 is useful for both operator and machine vision recognition and proper orientation and placement of land grid array package 100 for testing as well as assembly purposes. FIG. 2A depicts the configuration and pitch (spacing) P of lands 118, which are matched to the width and pitch of lead fingers of a lead frame to be assembled with land grid array package 100 as described below.

Figure 3:
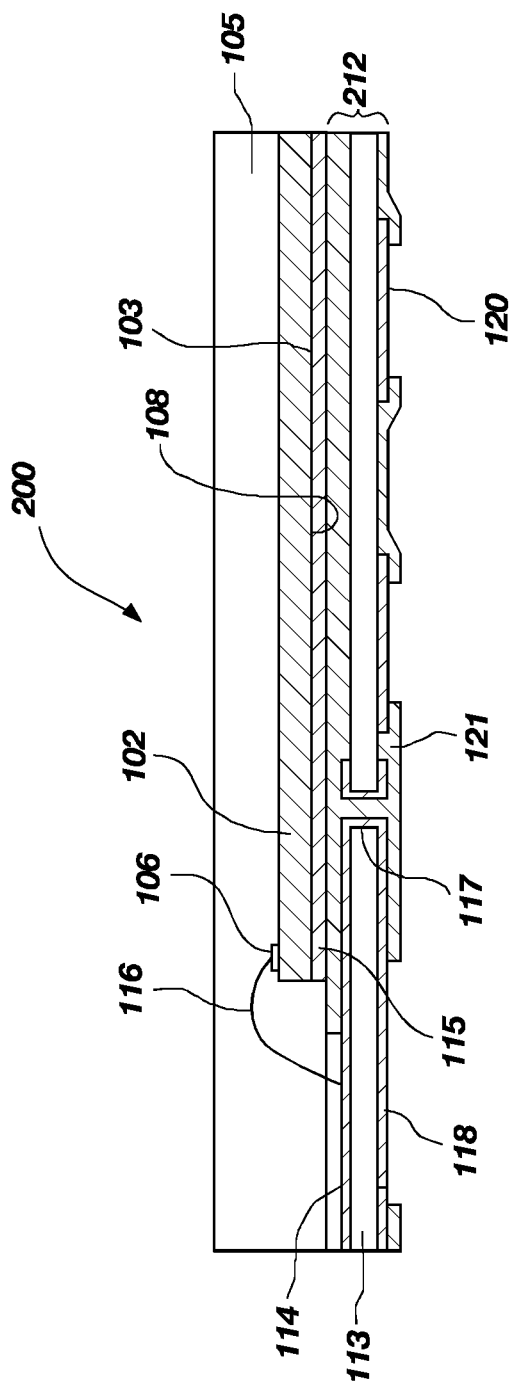
FIG. 3 is an enlarged, side sectional elevation of a portion of another land grid array package configuration according to the present invention.

FIG. 3 is an enlarged, side sectional view of a portion of another embodiment of a land grid array package 200 according to the present invention. Land grid array package 200 includes only a single semiconductor die 102 with bond pads 106 along opposing peripheral edges thereof. Semiconductor die 102 is mounted by its back side 108 to interposer substrate 212 by an adhesive element or layer 103, with wire bonds 116 extending between and electrically connecting bond pads 106 with terminal pads 114 of interposer substrate 212.

Interposer substrate 212, as with interposer substrate 112, includes a dielectric core or member 113 which carries conductive material thereon comprising terminal pads 114, conductive traces 115, lands 118 and pads 120, terminal pads 114 being electrically connected to lands 118 and test pads 120 by conductive traces 115 and conductively lined or filled via structures 117. Dielectric core 113 may comprise any suitable electrically insulative material such as, by way of example only, a polyimide film or sheet, BT resin, FR-4 or FR-5 laminate, or a ceramic, and terminal pads 114, conductive traces 115, conductively lined or filled via structures 117, lands 118 and pads 120 may be formed of any suitable conductive material such as, by way of example only, copper or aluminum. These conductive structures may be formed by conventional blanket deposition of the conductive material on dielectric core 113 and into via structures 117, followed by conventional application of a photoresist, masking, exposing and developing to define the conductive structures on each side of dielectric core 113, and etching away portions of the conductive material exposed by the photoresist pattern. Alternatively, interposer substrates 112 and 212 may be provided as a dielectric core 113 sandwiched between two conductive sheets, via structures 117 formed therethrough and conductively lined or filled, and then the conductive structures formed on the major surfaces thereof by conventional masking and etching. As may be easily seen in FIG. 3, a solder mask or other patterned dielectric layer 121 may be employed to cover both sides of interposer substrate 212 (as well as interposer substrate 112 of FIG. 1) to fill conductively lined (if not completely conductively filled) via structures 117, and leave terminal pads 114, lands 118 and pads 120 exposed.

Land grid array packages 100, 200 may then be open/short tested as well as functionally tested using pads 120 before further assembly with a lead frame or carrier substrate and other components, as further described below.

Figure 4:
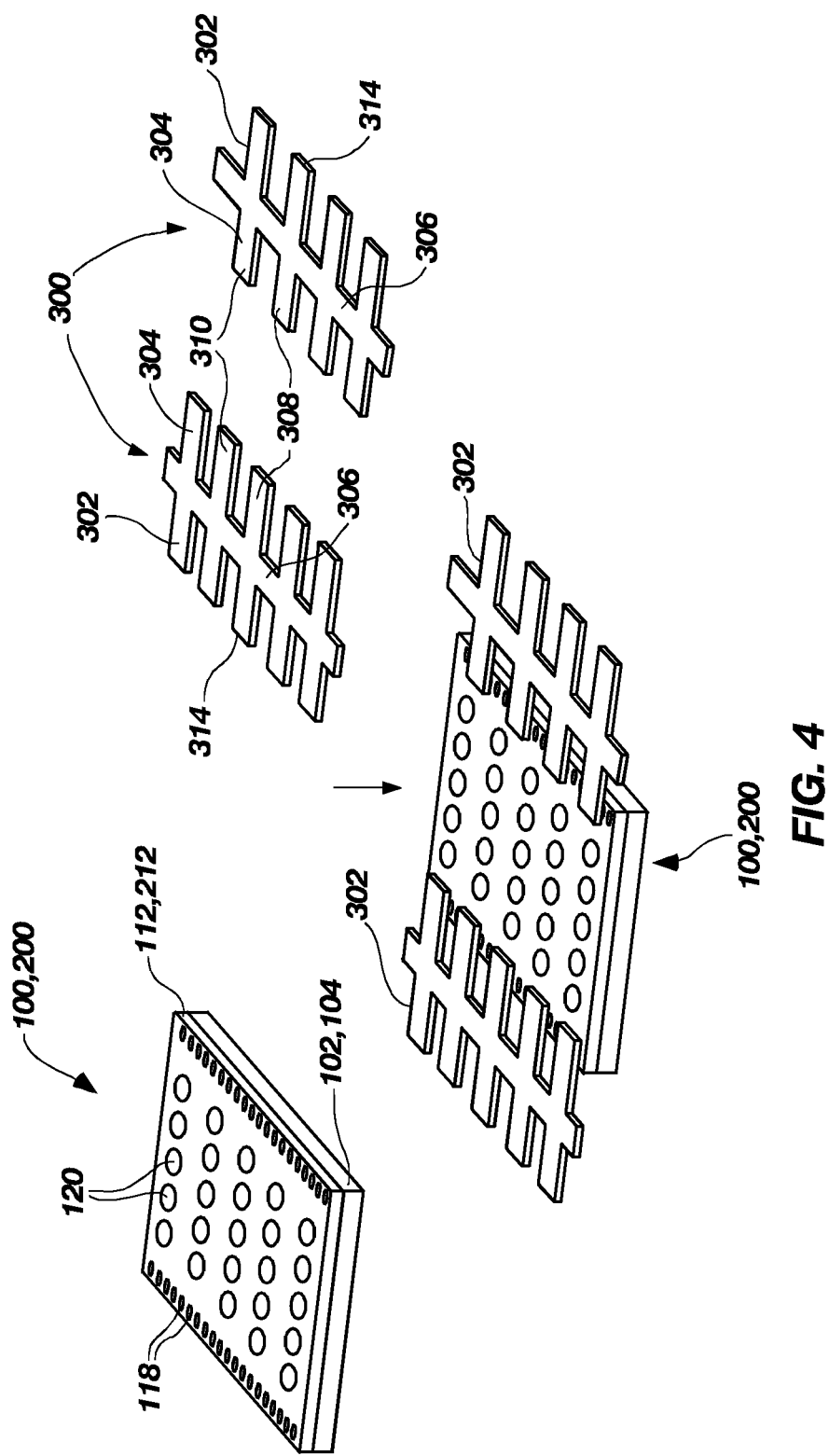
FIG. 4 is a perspective view of a land grid array package according to the present invention prior to, and after, assembly with a lead frame.

As depicted in FIG. 4, a land grid array package 100, 200 (shown in an inverted position as depicted in more detail in FIG. 1) may then be aligned with a lead frame 300 comprising two opposing lead frame segments 302 each including a plurality of lead fingers 304 separated by transversely extending segments 306, which as illustrated comprise tie bars integrally formed with lead fingers 304. For the sake of clarity, additional components mounted to interposer substrate 112, 212 as described below have been omitted from the drawing. Inner ends 308 of lead fingers 304 are placed over lands 118, and mechanically and electrically connected thereto by solder 310, which may be preplaced in a paste form, as by stenciling, on lands 118 or on inner ends 308, lands 118 being formed or coated with a solder-wettable material. The solder is reflowed to bond inner ends 308 to lands 118 by application of heat. Rather than soldering, lands 118 may be mechanically and electrically connected to inner ends 308 of lead fingers 304 using a conductive or conductor-filled epoxy, which may be cured to a B-stage (tacky) prior to assembly of the components and then further cured to form a solid, permanent bond. The outer ends 314 of lead fingers 304 protrude beyond land grid array package 100, 200.

Figure 5:
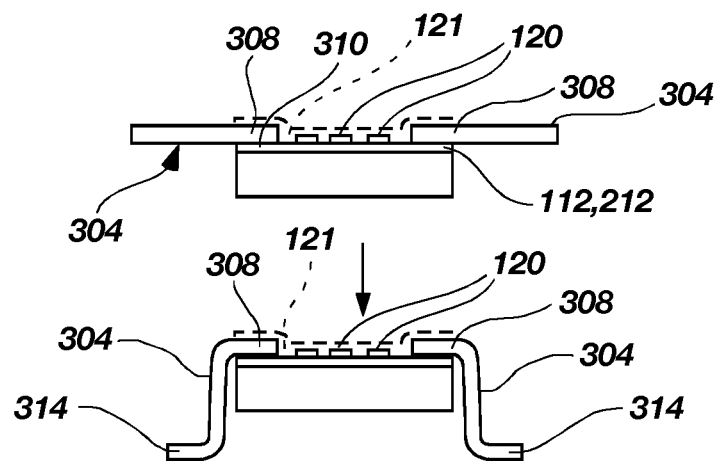
FIG. 5 is a schematic view of an embodiment of a land grid array package assembled with a lead frame according to the present invention before and after a trim and form operation.

As shown in FIG. 5, the assembly of lead frame 300 with land grid array package 100, 200, after assembly with additional components as described below (not shown for clarity in FIG. 5), may have a thin layer of dielectric material 316 applied as shown in broken lines to cover pads 120 and, optionally, inner ends 308 of lead fingers 304. Such a layer may comprise, for example, a polymer coating such as a polyimide, applied by a dispensing nozzle or spray head. A photopolymer may also be employed, applied by commercially available equipment and exposed to an appropriate wavelength of light (typically UV) to cure the photopolymer after or as it is applied. Lead fingers 304 may then be formed into a final configuration and transversely extending segments 306 removed in a conventional trim and form operation, as shown.

Figure 6:
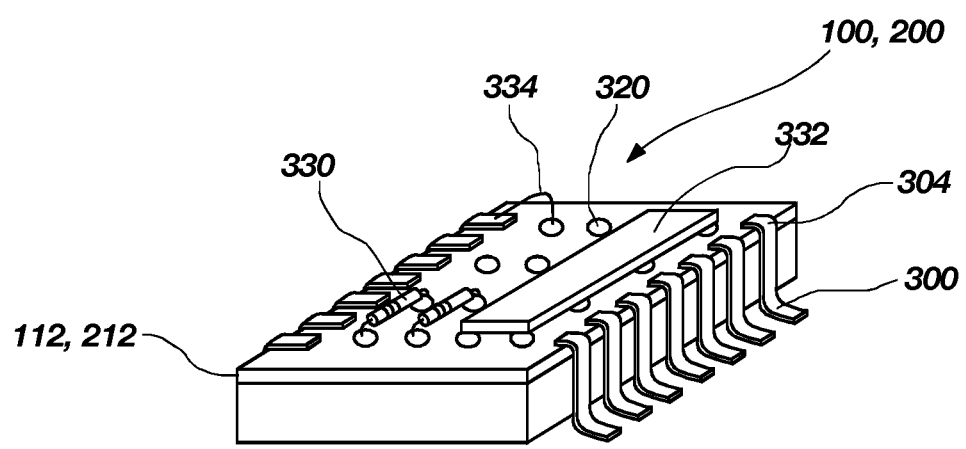
FIG. 6 is a perspective view of a land grid array package according to the invention after assembly with a lead frame and passive and active components, and depicting a wire bond connection to a lead finger of the lead frame in addition to the direct land connections.
Figure 7:
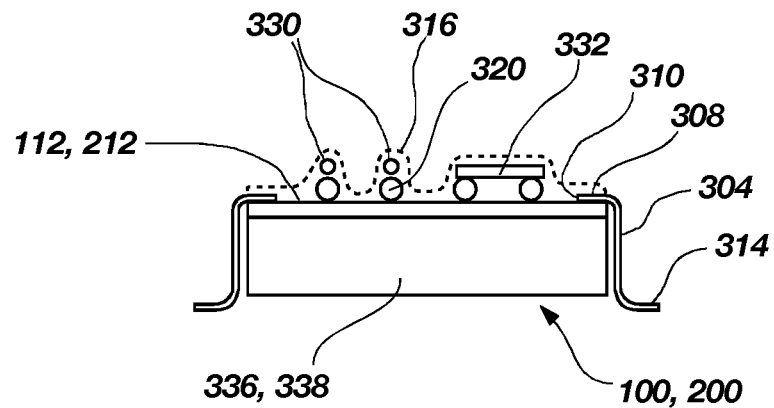
FIG. 7 is a side elevation of the land grid array package of FIG. 6.

As depicted in FIGS. 6 and 7, a land grid array package 100, 200 may have pads 120 of the two-dimensional array of pads conductively bumped with discrete conductive elements 320, as by use of a wire bond capillary head or formation or disposition and bonding of preformed conductive bump, ball, stud, column or pillar structures thereon as is known to those of ordinary skill in the art, to facilitate connection of other components to land grid array package 100, 200, or connecting wire bonds thereto. As depicted in FIGS. 6 and 7, land grid array package 100, 200 may be mechanically and electrically connected as described above to lead fingers 304 of a lead frame 300.

In one aspect of the present invention, one or more passive components (e.g., resistor, inductor, capacitor) 330 may be mechanically and electrically connected to pads 120 and, thus, to semiconductor dice 102, 104 and ultimately to higher-level packaging through discrete conductive elements 320. Similarly, one or more active components (semiconductor device) 332 may also be connected to pads 120 and, thus, to semiconductor dice 102, 104 and ultimately to higher-level packaging through discrete conductive elements 320. As noted above, if an active component 332 as depicted in FIG. 6 is configured as a flip-chip or otherwise bears its own array of discrete conductive elements arranged to align with a plurality of pads 120, those pads 120 need not be bumped and the discrete conductive elements carried by the active component may be used to connect directly to those pads 120. As shown in FIG. 6, both passive and active components may be connected to land grid array package 100, 200. As also shown in FIG. 6, wire bonds 334 may be formed between discrete conductive elements 320 (or, optionally directly on pads 120) and inner ends 308 of lead fingers 304 of lead frame 300. Such wire bonds may be used to bypass faulty signal, ground, bias or power paths within interposer substrate 112, 212, or to simplify the design and fabrication of the conductive paths within and on interposer substrate 112, 212.

As noted above, dielectric material 316 (not shown in FIG. 6 for clarity) may be disposed over interposer substrate 112, 212, as well as over passive and active components 330, 332 and wire bonds 334. If a component, such as illustrated active component 332, defines a considerable open volume 336 thereunder, a dielectric underfill 338 such as is used in conventional flip-chip and array-type assemblies may be disposed within volume 338 and around discrete conductive elements 320 to fill the open volume and enhance the mechanical connection of active component 332 to interposer substrate 112, 212 and another dielectric layer as described above applied over the assembly thereafter. Alternatively, a silicone "glob top" type of encapsulant may be disposed within open volume 336 and over components 330, 332, wire bonds 334 and inner ends 308 of lead fingers 304 in a single process.

Figure 8:
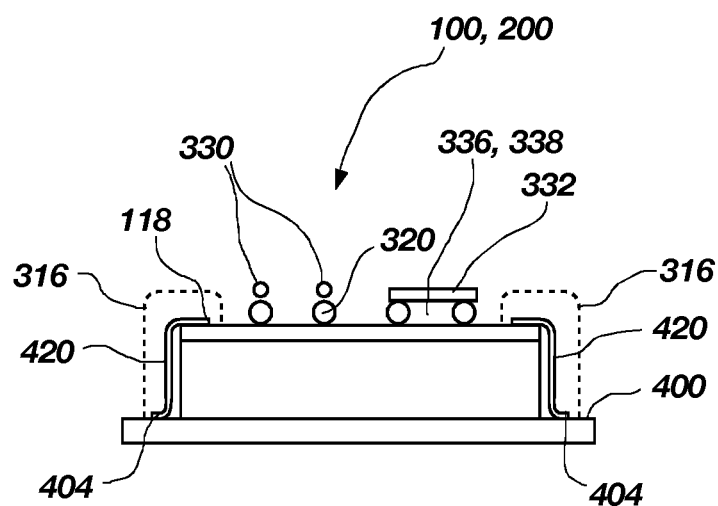
FIG. 8 is a side elevation of a land grid array package according to the present invention disposed on and connected to a carrier substrate in the form of a printed circuit board.

FIG. 8 depicts a land grid array package 100, 200 which is disposed on and connected to a carrier substrate 400 in the form of, for example, a printed circuit board such as, without limitation, a motherboard. Land grid array package 100, 200 is oriented with interposer substrate 112, 212 facing away from carrier substrate 400, and may be bonded thereto using, for example, a flowable adhesive or a dielectric tape or film carrying an adhesive layer on both sides thereof (not shown), as is conventional. Wire bonds 420 may then be formed between lands 118 and conductive pads 404 in communication with circuitry carried by carrier substrate 400. Lands 118, wire bonds 420 and conductive pads 404 may then be encapsulated by any of the techniques previously described. Passive and active components 330, 332 as well as wire bonds 334, may also be encapsulated as described above. It should be noted that wire bonds 420 may be extended from pads 120 more proximate a periphery of interposer substrate 112, 212 to conductive pads 404 and, if interposer substrate 112, 212 is provided with some electrically isolated pads 120, more interior pads 120 may be connected to conductive pads 404 using two wire bond segments using an electrically isolated pad 120 as a "jumper" pad.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims which follow.

What is claimed is:

1. A method of fabricating a semiconductor device package, the method comprising:
   providing an interposer substrate comprising a dielectric member, a plurality of terminals proximate and extending along at least one peripheral edge thereof on one side thereof and an array of lands proximate and extending along a same at least one peripheral edge on an opposing side of the interposer substrate, terminals of the plurality of terminals being respectively electrically connected to lands of the land array through conductive via structures extending through the dielectric member, the interposer substrate further comprising a two-dimensional array of pads substantially centrally located on the opposing side of the interposer substrate, and wherein the terminals of the plurality of terminals that are respectively electrically connected to lands of the array of lands are respectively electrically connected to pads of the two-dimensional pad array;
   mechanically and electrically connecting at least one electrical component to the interposer substrate through pads of the two-dimensional pad array;
   mounting at least one semiconductor die by a back side thereof to the one side of the interposer substrate with a plurality of bond pads on an active surface opposite the back side thereof, the plurality of bond pads proximate and extending along at least one peripheral edge thereof adjacent the at least one peripheral edge of the interposer substrate;
   respectively electrically connecting the plurality of bond pads to the plurality of terminals;
   disposing an encapsulant structure over the at least one semiconductor die and the one side of the interposer substrate;
   respectively disposing inner ends of a plurality of lead fingers of a lead frame over lands of the land array on the opposing side of the interposer substrate; and
   electrically connecting the inner ends of the plurality of lead fingers to respective lands of the land array thereunder.

2. The method of claim 1, further comprising selecting the at least one electrical component from the group consisting of passive components and active components.

3. The method of claim 1, further comprising disposing discrete conductive elements on at least some of the pads of the two-dimensional pad array and connecting the at least one electrical component to the pads through some of the discrete conductive elements.

4. The method of claim 3, further comprising disposing a dielectric underfill material in an open volume between the at least one electrical component and the opposing side of the interposer substrate and about the discrete conductive elements by which the at least one electrical component is connected to the pads of the two-dimensional pad array.

5. The method of claim 1, further comprising disposing discrete conductive elements on at least some of the pads of the two-dimensional pad array.

6. The method of claim 1, further comprising mechanically connecting the inner ends of the plurality of lead fingers to the respective lands of the land array thereunder.

7. The method of claim 6, further comprising extending a wire bond between at least one pad of the two-dimensional pad array and an inner end of at least one lead finger.

8. The method of claim 6, further comprising covering at least the inner ends of the lead fingers and the opposing side of the interposer substrate with a dielectric material.

9. The method of claim 6, further comprising covering the at least one electrical component with a dielectric material.

10. The method of claim 1, further comprising selecting the at least one electrical component to comprise a plurality of components including at least one passive component and at least one active component.

11. The method of claim 1, further comprising:
   affixing a carrier substrate to the semiconductor device package by a side thereof opposite the interposer substrate, the carrier substrate including a plurality of conductive pads on a surface thereof to which the semiconductor device package is affixed; and
   extending wire bonds between lands of the land array and conductive pads of the plurality of conductive pads.

12. The method of claim 11, further comprising extending a wire bond between at least one pad of the two-dimensional pad array and a conductive pad of the carrier substrate.

13. The method of claim 12, wherein extending the wire bond between at least one pad of the two-dimensional pad array and a conductive pad of the carrier substrate comprises extending the wire bond in two segments joined at an electrically isolated pad of the two-dimensional pad array.

14. The method of claim 11, further comprising covering at least the lands of the land array, the wire bonds and the conductive pads with a dielectric material.

15. The method of claim 11, further comprising covering the at least one electrical component with a dielectric material.

16. The method of claim 1, further comprising selecting the at least one peripheral edge of each of the interposer substrate and the at least one semiconductor die to comprise two opposing peripheral edges.

17. The method of claim 1, further comprising electrically connecting the plurality of bond pads to the plurality of terminals with wire bonds.

18. The method of claim 1, further comprising:
selecting the at least one semiconductor die to comprise a first semiconductor die and a second semiconductor die;
mounting the first semiconductor die by a back side thereof on the interposer substrate;
mounting the second semiconductor die by a back side thereof on the active surface of the first semiconductor die in a manner to leave the plurality of bond pads of the first semiconductor die exposed.

19. The method of claim 18, further comprising electrically connecting the plurality of bond pads of each of the first semiconductor die and the second semiconductor die to the plurality of terminals with wire bonds.

20. The method of claim 1, further comprising forming the encapsulant structure to extend to peripheral edges of the interposer substrate.

21. The method of claim 1, further comprising testing the at least one semiconductor die after mounting to the interposer substrate and connection of the plurality of bond pads to the plurality of terminals and before assembly thereof with additional structures.

22. The method of claim 21, wherein testing comprises at least one of open/short testing and functional testing.

* * * * *